(12) United States Patent
Jung et al.

(10) Patent No.: US 10,629,663 B2
(45) Date of Patent: Apr. 21, 2020

(54) ELECTROLUMINESCENCE DISPLAY DEVICE

(71) Applicant: LG Display Co., Ltd., Seoul (KR)

(72) Inventors: Nackyoun Jung, Paju-si (KR); Sangbin Lee, Paju-si (KR); Jeongmook Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/208,954

(22) Filed: Dec. 4, 2018

(65) Prior Publication Data

US 2019/0181200 A1    Jun. 13, 2019

(30) Foreign Application Priority Data

Dec. 7, 2017    (KR) .......................... 10-2017-0167690

(51) Int. Cl.
| | |
|---|---|
| *H01L 29/08* | (2006.01) |
| *H01L 35/24* | (2006.01) |
| *H01L 51/00* | (2006.01) |
| *H01L 27/32* | (2006.01) |
| *H01L 51/52* | (2006.01) |
| *H01L 51/50* | (2006.01) |

(52) U.S. Cl.
CPC ...... *H01L 27/3246* (2013.01); *H01L 27/3223* (2013.01); *H01L 51/5012* (2013.01); *H01L 51/5203* (2013.01); *H01L 27/3211* (2013.01); *H01L 51/5225* (2013.01)

(58) Field of Classification Search
USPC .............................. 257/13, 40, 79–103, 918, 257/E51.018–E51.022, E33.001–E33.007, 257/E33.054, E25.028, E25.032, 257/252–254, 257–258; 438/22–47, 69, 438/493, 503, 507, 956, 48
See application file for complete search history.

(56) References Cited

U.S. PATENT DOCUMENTS

| | | | |
|---|---|---|---|
| 2019/0181376 A1* | 6/2019 | Kim .................... H01L 27/3246 |
| 2019/0189960 A1* | 6/2019 | Paek ................... H01L 51/5253 |
| 2019/0206956 A1* | 7/2019 | Kim .................... H01L 27/3246 |

FOREIGN PATENT DOCUMENTS

KR    10-2014-0075320 A    6/2014

* cited by examiner

*Primary Examiner* — Niki H Nguyen
(74) *Attorney, Agent, or Firm* — Morgan, Lewis & Bockius LLP

(57) ABSTRACT

An electroluminescence display apparatus includes: a substrate including: an active area, and a dummy area, a bank on the substrate, the bank being configured to define: a plurality of emission areas in the active area, and a plurality of dummy emission areas in the dummy area, a light-emitting layer in each of the plurality of emission areas, and a dummy light-emitting layer in each of the plurality of dummy emission areas, a thickness of the dummy light-emitting layer being greater than a thickness of the light-emitting layer.

18 Claims, 7 Drawing Sheets

ELECTROLUMINESCENCE DISPLAY DEVICE

CROSS-REFERENCE TO RELATED APPLICATION(S)

This application claims the benefit of and priority to Korean Patent Application No. 10-2017-0167690, filed on Dec. 7, 2017, the entirety of which is hereby incorporated by reference.

BACKGROUND

1. Technical Field

The present disclosure relates to an electroluminescence display device, and more particularly, to an electroluminescence display device in which uniform light emission may be obtained in an active area.

2. Discussion of the Related Art

An electroluminescence display apparatus has a structure in which a light-emitting layer is formed between two electrodes, and the light-emitting layer emits light by an electric field between the two electrodes to display an image. The light-emitting layer may be formed of an organic material that emits light as excitons are generated by the combination of electrons and holes, and are dropped from an exited state to a ground state. Otherwise, the light-emitting layer may be formed of an inorganic material, such as quantum dot.

Hereinafter, an electroluminescence display apparatus according to the related art will be described with reference to the drawings.

Figure 1:
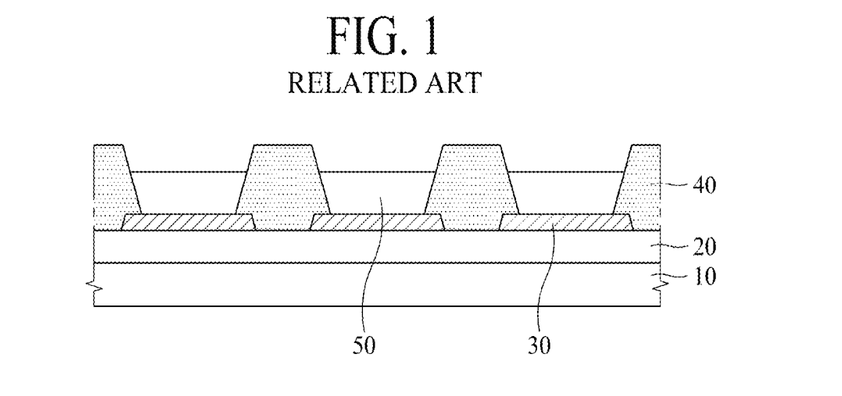
FIG. 1 is a cross-sectional view of the electroluminescence display apparatus according to the related art.

FIG. 1 is a cross-sectional view of the electroluminescence display apparatus according to the related art.

As illustrated in FIG. 1, the electroluminescence display apparatus according to the related art may include a substrate 10, a circuit element layer 20, a first electrode 30, a bank 40 and a light-emitting layer 50. The circuit element layer 20 is formed on the substrate 10. Various signal lines, thin film transistors (TFTs), capacitors, and the like, are formed on the circuit element layer 20.

The first electrode 30 is formed on the circuit element layer 20. The first electrode 30 is patterned and formed in each pixel and serves as an anode of the electroluminescence display apparatus. The bank 40 has a matrix structure to define emission areas. The light-emitting layer 50 is formed in an emission area defined by the bank 40.

The electroluminescence display apparatus according to the related art may have a problem in which light emission in a middle region of the substrate 10 and light emission in an edge region of the substrate 10 are not uniform. To form the pixel, a plurality of stacking/depositing processes and a plurality of masking processes are performed. Here, in terms of the characteristics of the stacking processes and the masking processes, a process error is likely to occur between the middle portion of the substrate 10 and the edge region of the substrate 10, and light emission in the pixel of the middle region of the substrate 10 and light emission of the edge region of the substrate 10 may not be uniform.

For example, when the light-emitting layer 50 is formed through an ink jet process, drying of the light-emitting layer 50 may be different in the middle region of the substrate 10 and in the edge region of the substrate 10. In this case, light emission in the pixel of the middle region of the substrate 10 and light emission in the pixel of the edge region of the substrate 10 are not uniform.

SUMMARY

Accordingly, embodiments of the present disclosure are directed to an electroluminescence display device that substantially obviates one or more of the issues due to limitations and disadvantages of the related art.

An aspect of the present disclosure is to provide an electroluminescence display device in which light emission is uniform in the entire active area displaying an image.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an electroluminescence display apparatus, including: a substrate including: an active area, and a dummy area, a bank on the substrate, the bank being configured to define: a plurality of emission areas in the active area, and a plurality of dummy emission areas in the dummy area, a light-emitting layer in each of the plurality of emission areas, and a dummy light-emitting layer in each of the plurality of dummy emission areas, a thickness of the dummy light-emitting layer being greater than a thickness of the light-emitting layer.

In another aspect, there is provided an electroluminescence display apparatus, including: a substrate including: an active area, and a dummy area, a bank on the substrate and configured to define: a plurality of emission areas in the active area, and a plurality of dummy emission areas in the dummy area, a dummy light-emitting layer in each of the plurality of dummy emission areas, a first electrode below the dummy light-emitting layer, and a second electrode above the dummy light-emitting layer, wherein the dummy light-emitting layer has a thickness such that no light emission occurs by an electric field between the first electrode and the second electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this disclosure, illustrate embodiments of the disclosure and together with the description serve to explain various principles of the disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present disclosure are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, example embodiments of the present disclosure will be described in detail with reference to the accompanying drawings.

Figure 2:
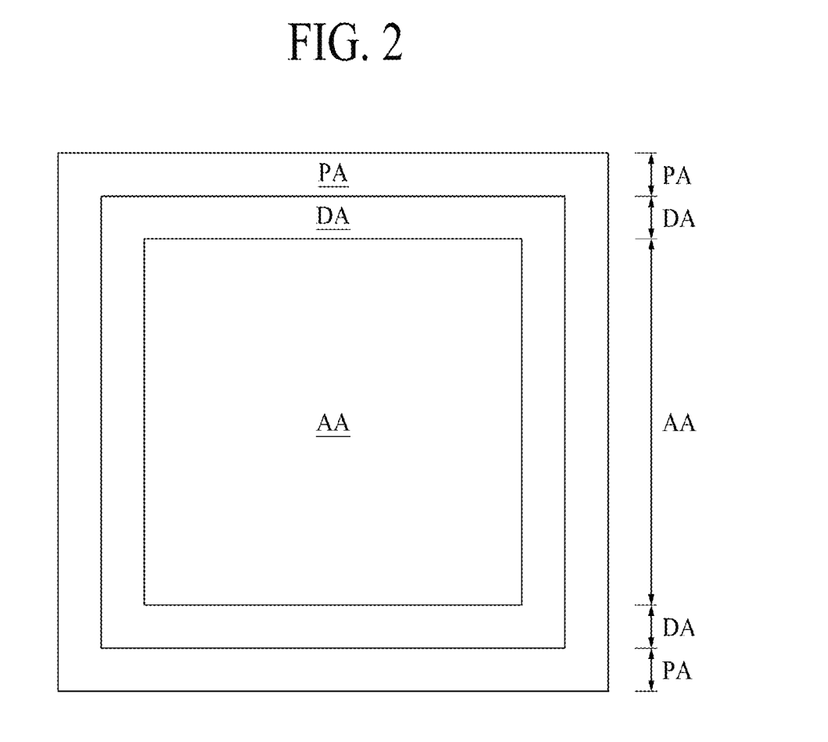
FIG. 2 is a plan view of an electroluminescence display apparatus according to an embodiment of the present disclosure.

FIG. 2 is a plan view of an electroluminescence display apparatus according to an embodiment of the present disclosure.

As illustrated in FIG. 2, an electroluminescence display apparatus according to an embodiment of the present disclosure may include an active area AA, a dummy area DA, and a pad area PA.

The active area AA serves as a display area displaying an image. The active area AA may include a plurality of pixels, and each of the plurality of pixels has an emission area.

For example, each pixel provided in the active area AA may include signal lines, such as a gate line, a data line, a power line, and a reference line, a plurality of thin film transistors (TFTs) for switching the transmission of a signal applied through the signal lines, and a light-emitting device driven by the plurality of thin film transistors to emit light.

The dummy area DA may surround the active area AA. For example, the dummy area DA may be at upper, lower, left, and right outer portions of the active area AA. A plurality of dummy pixels may be in the dummy area DA, and a dummy emission area may be in each of the plurality of dummy pixels. Because the dummy area DA is not a display area for displaying an image, the dummy pixels in the dummy area DA may be different from the pixels provided in the active area AA. For example, a dummy pixel in the dummy area DA may not have or may partially have at least one of the signal line, the thin film transistor, and a light-emitting device, so that light emission may not occur in the dummy pixel provided in the dummy area DA. When a light emission occurs in the dummy area DA, the display quality of the electroluminescence display apparatus may be degraded by the leakage of light that occurs in the dummy area DA.

The dummy area DA may reduce or prevent the occurrence of a process error between the middle portion and an outer portion of the active area AA. This will be described in detail as follows.

To form a plurality of pixels in the active area AA, a plurality of stacking processes and a plurality of masking processes may be performed. The stacking process may be a process of forming a predetermined insulating layer, a metal layer, an organic layer, and the like, e.g., through a physical vapor deposition process, a chemical vapor deposition process, a coating process, or an inkjet process. The masking process may be a process of patterning and forming the insulating layer, the metal layer, the organic layer, and the like, e.g., formed by the stacking process to have a predetermined shape or pattern through a photolithography process known in the art.

When the plurality of stacking processes and the plurality of masking processes are performed on the active area AA as described above, a process error may occur between the middle portion and the edge of the active area AA in terms of process characteristics. Therefore, by forming the dummy area DA at the edge of the active area AA, an error may be induced to occur in the dummy area DA, rather than in the active area AA.

For example, when the light-emitting layer in the light-emitting device is formed by an ink jet process, drying of the light-emitting layer may be different between the middle portion and the edge of the substrate. In this case, without the dummy area DA, light emission between the middle portion and the edge of the active area AA may not be uniform.

Therefore, when the dummy area DA is formed at the outer portion of the active area AA, when the light-emitting layer in the light-emitting device is formed through an ink jet process, drying of the light-emitting layer may not be uniform between the active area AA and the dummy area DA but drying of the light-emitting layer may be uniform overall inside of the active area AA.

The pad area PA may be at an outer portion of the dummy area DA. A circuit driving unit, such as a gate driver, a data driver, and the like, may be in the pad area PA. The circuit driving unit may be in at least one of upper, lower, left, and right outer portions of the dummy area DA. The circuit driving unit in the pad area PA may be connected to a circuit element in the active area AA by way of the dummy area DA.

Figure 3:
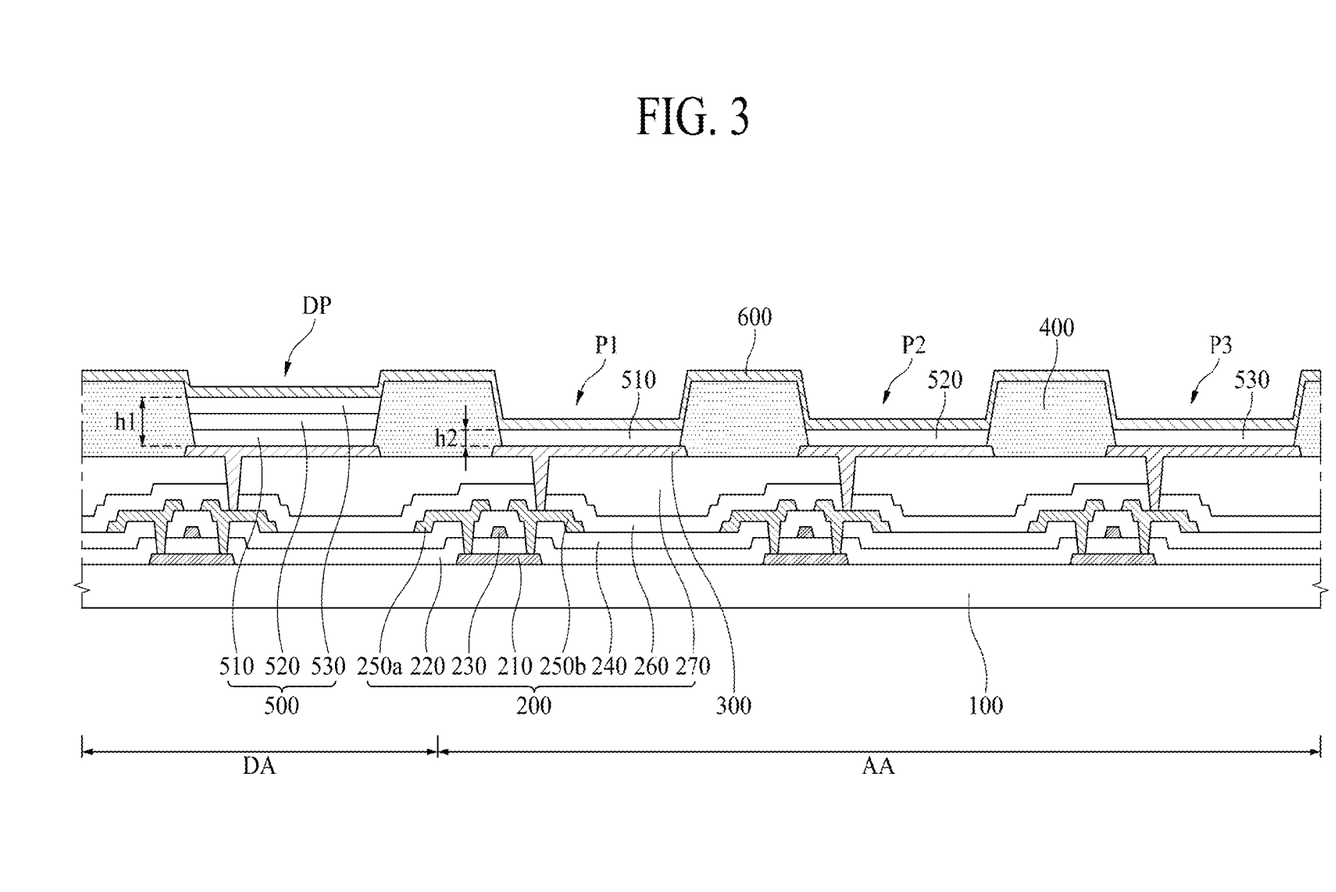
FIG. 3 is a cross-sectional view of an electroluminescence display apparatus according to an embodiment of the present disclosure.

FIG. 3 is a cross-sectional view of an electroluminescence display apparatus according to an embodiment of the present disclosure.

As illustrated in FIG. 3, the electroluminescence display apparatus according to an embodiment of the present disclosure may include the active area AA and the dummy area DA on a substrate 100. The substrate 100 may be formed of glass or plastic, but embodiments are not limited thereto. The substrate 100 may be formed of a transparent material or an opaque material.

The electroluminescence display apparatus according to an embodiment of the present disclosure may be a top-emission type in which light may be emitted upwards. In this case, as a material of the substrate 100, an opaque material, as well as a transparent material, may be used. Also, the electroluminescence display apparatus according to an embodiment of the present disclosure may be a bottom-emission type in which light may be emitted downwards. In this case, as a material of the substrate 100, a transparent material may be used.

A circuit element layer 200, a first electrode 300, a bank 400, light-emitting layers 510, 520, and 530, and a second electrode 600 may be in the active area AA on the substrate. The circuit element layer 200 may be on the substrate 100. The circuit element layer 200 may include an active layer 210, a gate insulating layer 220, a gate electrode 230, an interlayer insulating layer 240, a source electrode 250a, a drain electrode 250b, a passivation layer 260, and a planarization layer 270.

The active layer 210 may be on the substrate 100. The active layer 210 may be formed of a silicon-based semiconductor material or an oxide semiconductor material, but embodiments are not limited thereto. Although not shown, a light blocking layer may be additionally provided between the substrate 100 and the active layer 210 to prevent light from entering into the active layer 210, thus reducing or preventing deterioration of the active layer 210.

The gate insulating layer 220 may be on the active layer 210 to insulate the active layer 210 from the gate electrode 230. The gate electrode 230 may be on the gate insulating layer 220. The interlayer insulating layer 240 may be on the gate electrode 230 to insulate the gate electrode 230 from the source/drain electrodes 250a and 250b.

The source electrode 250a and the drain electrode 250b may be spaced apart from each other on the interlayer insulating layer 240 to face each other. The source electrode 250a and the drain electrode 250b may be connected to one end and the other end of the active layer 210 through a contact hole provided on the interlayer insulating layer 240 and the gate insulating layer 220, respectively.

The passivation layer 260 may be on the source electrode 250a and the drain electrode 250b, and may protect the thin film transistor. The planarization layer 270 may be on the passivation layer 260 to planarize a surface above the substrate 100.

In this manner, the circuit element layer 200 may include a thin film transistor (TFT) including the gate electrode 230, the active layer 210, the source electrode 250a, and the drain electrode 250b. FIG. 3 illustrates a thin film transistor having a top gate structure in which the gate electrode 230 is formed on an active layer 210, but embodiments are not limited thereto. For example, a thin film transistor having a bottom gate structure in which the gate electrode 230 is formed below the active layer 210 may also be formed in the circuit element layer 200.

The circuit element layer 200 may include a circuit element having various signal lines, a thin film transistor, a capacitor, and the like, in each pixel. The signal lines may include a gate line, a data line, a power line, and a reference line, and the thin film transistors may include a switching thin film transistor, a driving thin film transistor, and a sensing thin film transistor. The thin film transistor illustrated in FIG. 3 may correspond to the driving thin film transistor.

The switching thin film transistor may be switched according to a gate signal supplied to the gate line to supply a data voltage supplied from the data line to the driving TFT. The driving thin film transistor may be switched according to a data voltage supplied from the switching thin film transistor to generate a data current from power supplied from the power line, and to supply the generated data current to the first electrode 300.

The sensing thin film transistor may sense a threshold voltage variation of the driving thin film transistor that may cause deterioration of image quality. In response to a sensing control signal supplied from the gate line or the separate sensing line, the sensing thin film transistor may supply a current from the driving thin film transistor to the reference line.

The capacitor, which may maintain the data voltage supplied to the driving thin film transistor during one frame, may be connected to each of a gate terminal and a source terminal of the driving thin film transistor.

When the electroluminescence display apparatus according to an embodiment of the present disclosure is configured as a top-emission type, although the thin film transistor may be disposed below the light-emitting layer 500, light emission may not be affected by the thin film transistor. Thus, the thin film transistor may be below the light-emitting layer 500.

The first electrode 300 may be on the circuit element layer 200. The first electrode 300 may be patterned and formed in each of a plurality of pixels P1, P2, and P3, and may serve as an anode of the electroluminescence display apparatus.

When the electroluminescence display apparatus according to an embodiment of the present disclosure is configured as a top-emission type, the first electrode 300 may include a reflective material for reflecting light emitted from the light-emitting layer 500 upwards. In this case, the first electrode 300 may have a stacked structure of a transparent conductive material and the reflective material. When the electroluminescence display apparatus according to an embodiment of the present disclosure is a bottom-emission type, the first electrode 300 may be formed of a transparent conductive material.

The first electrode 300 may be connected to the drain electrode 250b of the thin film transistor through a contact hole formed in the planarization layer 270 and the passivation layer 260. In some examples, the first electrode 300 may be connected to the source electrode 250a of the thin film transistor through the contact hole formed in the planarization layer 270 and the passivation layer 260.

The bank 400 may be formed between the plurality of pixels P1, P2, and P3. The bank 400 may be formed in a matrix structure overall, and may define an emission area in the individual pixels P1, P2, and P3.

The bank 400 may be on the planarization layer 270, while covering both ends of the first electrode 300. Thus, the plurality of first electrodes patterned and formed respectively in the plurality of pixels P1, P2, and P3 may be insulated by the bank 400.

The light-emitting layers 510, 520, and 530 may be on the first electrode 300. The light-emitting layers 510, 520, and 530 may be formed in the emission areas defined by the bank 400. For example, the light-emitting layers 510, 520, and 530 may be formed in emission areas defined by the bank 400. For example, the light-emitting layers 510, 520, and 530 may include a first light-emitting layer 510 in a first emission area in a first pixel P1, a second light-emitting layer 520 in a second emission area in a second pixel P2, and a third light-emitting layer 530 in a third emission area in a third pixel P3.

The first light-emitting layer 510, the second light-emitting layer 520, and the third light-emitting layer 530 may emit light in different colors. For example, the first light-emitting layer 510 may emit red light, the second light-emitting layer 520 may emit green light, and the third light-emitting layer 530 may emit blue light. However, embodiments of the present disclosure are not limited thereto. For example, the first light-emitting layer 510, the second light-emitting layer 520, and the third light-emitting layer 530 may emit the same white light. In this case, a color filter may be additionally provided in each of the plurality of pixels P1, P2, and P3 in a traveling path of light emitted from the light-emitting layers 510, 520, and 530.

The light-emitting layers 510, 520, and 530 may be patterned and formed respectively in the plurality of pixels through evaporation using a mask, or may be patterned and formed in the plurality of pixels P1, P2, and P3 through a solution process using ink jet equipment without a mask. In some cases, the light-emitting layers 510, 520, and 530 may be formed overall in the plurality of pixels P1, P2, and P3 and boundary regions therebetween through the evaporation without using a mask, and in this case, the light-emitting layers 510, 520, and 530 may emit the white light. That is, the light-emitting layers 510, 520, and 530 may be formed even on upper surfaces of the bank 400 corresponding to the boundary regions between the plurality of pixels P1, P2, and P3. The light-emitting layers 510, 520, and 530 may include at least one organic layer of a hole injecting layer (HIL), a hole transporting layer (HTL), an organic emitting layer (OEL), an electron transporting layer (ETL), and an electron injecting layer (EIL).

The second electrode 600 may be formed on the light-emitting layers 510, 520, and 530, and may serve as a cathode of the electroluminescence display apparatus. The second electrode 600 may be formed. not only on the light-emitting layers 510, 520, and 530. but also on the bank 400. Therefore, the second electrode 600 may serve as a common electrode applying a common voltage to the plurality of pixels P1, P2, and P3.

The circuit element layer 200, the first electrode 300, the bank 400, the dummy light-emitting layer 500, and the second electrode 600 may be in the dummy area DA on the substrate 100. The circuit element layer 200 in the dummy area DA may be formed through the same process to have the same structure as that of the circuit element layer 200 formed in the active area AA.

However, embodiments of the present disclosure are not limited thereto. For example, the circuit element layer 200 formed in the dummy area DA may not include some of the signal lines, such as the gate line, the data line, the power line, the reference line, and the like, or may not have some of the switching thin film transistor and the driving thin film transistor. Thus, light emission may not be made in the dummy area DA. In some cases, the circuit element layer 200 in the dummy area DA may be incompletely or partially formed, such that either the switching thin film transistor or the driving thin film transistor may not operate.

The first electrode 300 in the dummy area DA may be formed through the same process to have the same structure as the first electrode 300 in the active area AA. However, the first electrode 300 may not be formed in the dummy area DA, so that light emission may not be made in the dummy area DA. In some cases, the first electrode 300 in the dummy area DA may not be connected to the drain electrode 250b or the source electrode 250a of the thin film transistor so that light emission may not be made in the dummy area DA.

The bank 400 in the dummy area DA may be between the plurality of dummy pixels DP. The bank 400 in the dummy area DA may define a dummy emission area in the individual dummy pixels DP. Although only one dummy pixel DP is illustrated in the dummy area DA, a plurality of dummy pixels DP may be provided in the dummy area DA. The bank 400 may be on the planarization layer 270, while covering both ends of the first electrode 300 in the dummy area DA. Therefore, the plurality of first electrodes 300, formed respectively in the plurality of dummy pixels DP, may be insulated by the bank 400.

The bank 400 in the dummy area DA may have a matrix form overall, like the bank 400 in the active area AA, to define dummy emission areas in the individual dummy pixels DP. As a result, the bank 400 may be formed in a matrix structure in the entirety of the active area AA and the dummy area DA.

The dummy light-emitting layer 500 in the dummy area DA may have a structure different from that of the light-emitting layers 510, 520, and 530 in the active area AA. As described above, the light-emitting layers 510, 520, and 530 in the active area AA may include the first light-emitting layer 510 in the first emission area in the first pixel P1, the second light-emitting layer 520 in the second emission area in the second pixel P2, and the third light-emitting layer 530 in the third emission area in the third pixel P3. That is, each of the individual light-emitting layers 510, 520, and 530 may be in the individual pixels P1, P2, and P3 in the active area AA, respectively.

In contrast, the dummy light-emitting layer 500 in the dummy area DA may have a stacked structure of the first light-emitting layer 510, the second light-emitting layer 520, and the third light-emitting layer 530 in one dummy emission area in one dummy pixel DP. That is, the plurality of light-emitting layers 510, 520, and 530 may be stacked in the dummy light-emitting layer 500 in the individual dummy pixel DP. Here, the first light-emitting layer 510 in the dummy area DA may be formed of the same material and may have the same thickness as those of first light-emitting layer 510 in the active area AA, the second light-emitting layer 520 in the dummy area DA may be formed of the same material and may have the same thickness as those of the second light-emitting layer 520 in the active area AA, and the third light-emitting layer 530 in the dummy area DA may be formed of the same material and have the same thickness as those of the third light-emitting layer 530 in the active area AA. In this manner, when the dummy light-emitting layer 500 has the stacked structure of the same material layers as the light-emitting layers 510, 520, and 530 in the active area AA, a thickness h1 of the dummy light-emitting layer 500 may be increased.

Because the dummy area DA is not a display area for displaying an image, the dummy pixel DP provided in the dummy area DA may not emit light. When a light emission occurs in the dummy area DA, the display quality of the electroluminescence display apparatus may be degraded due to the leakage of the light that occurs in the dummy area DA.

To prevent the occurrence of the light emission in the dummy pixel DP, the circuit element layer 200 provided in the dummy area DA may be configured to not operate, the first electrode 300 may not be provided in the dummy area DA, or the first electrode 300 of the dummy area DA may not be connected to the circuit element layer 200. According to an embodiment of the present disclosure, to prevent the occurrence of light emission from in the dummy pixel DP, a method of preventing the occurrence of the light emission from the dummy light-emitting layer 500 formed in the dummy area DA is provided.

To cause the light emission in the dummy light-emitting layer 500 in the dummy area DA, electrons and holes may be combined in the dummy light-emitting layer 500 by an electric field between the first electrode 300 and the second electrode 600 provided in the dummy area DA to generate excitons. For the electrons and holes to be combined in the dummy light-emitting layer 500 in the dummy area AD, the thickness h1 of the dummy light-emitting layer 500 may be set in consideration of a voltage between the first electrode 300 and the second electrode 600.

According to an embodiment of the present disclosure, the thickness h1 of the dummy light-emitting layer 500 may be large, such that electrons and holes may not be combined therein in a voltage range between the first electrode 300 and the second electrode 600, thus preventing the occurrence of light emission in the dummy light-emitting layer 500. That is, a voltage range between the first electrode 300 and the second electrode 600 may be set to be appropriate for a thickness h2 of the individual light-emitting layers 510, 520, and 530 in the active area AA, whereby light emission may be made in the individual light-emitting layers 510, 520, and 530 in the active area AA, but the light emission may not occur in the dummy light-emitting layer 500 in the dummy area DA.

Therefore, the thickness h1 of the dummy light-emitting layer 500 in the dummy area DA may be larger than the thickness h2 of the individual light-emitting layers 510, 520, and 530 in the active area AA. For example, the thickness h1 of the dummy light-emitting layer 500 may be within a range of 1.5 to 3 times the thickness h2 of the individual light-emitting layers 510, 520, and 530 in the active area AA. When the thickness h1 of the dummy light-emitting layer 500 is less than 1.5 times the thickness h2 of the individual light-emitting layers 510, 520 and 530 in the active area AA, the light emission may occur in the dummy light-emitting layer 500. Further, when the thickness h1 of the dummy light-emitting layer 500 exceeds 3 times the thickness h2 of the individual light-emitting layers 510, 520, and 530 in the active area AA, a process time for forming the dummy light-emitting layer 500 may be increased, and a material cost may be wasted. The thickness h1 of the dummy light-emitting layer 500 in the dummy area DA refers to a thickness of a region having a smallest thickness in the regions of the dummy light-emitting layer 500, and the thickness h2 of the individual light-emitting layers 510, 520, and 530 refers to a thickness of a region having a smallest thickness in the regions of the individual light-emitting layers 510, 520, and 530.

The dummy light-emitting layer 500 may have a structure in which the first light-emitting layer 510, the second light-emitting layer 520, and the third light-emitting layer 530 may be sequentially stacked as illustrated, but embodiments of the present disclosure are not limited thereto. For example, a stacking order of the first light-emitting layer 510, the second light-emitting layer 520, and the third light-emitting layer 530 may be variously changed. The dummy light-emitting layer 500 may have a structure in which any two of the first light-emitting layer 510, the second light-emitting layer 520, and the third light-emitting layer 530 may be stacked.

The second electrode 600 in the dummy area DA may extend from the second electrode 600 in the active area AA. However, the second electrode 600 may not be formed in the dummy area DA. Thus, light emission may not occur in the dummy area DA.

Although not shown, an encapsulation layer may be additionally formed on the second electrode 600 to prevent permeation of moisture or ambient air in the entirety of the dummy area DA and the active area AA. The encapsulation layer may be formed of an inorganic insulating material, or may have a structure in which an inorganic insulating material and an organic insulating material are alternately stacked, but embodiments of the present disclosure are not limited thereto.

In this manner, according to an embodiment of the present disclosure, when the dummy light-emitting layer 500 is provided with the thickness h1 in which the light emission does not occur in the voltage range between the first electrode 300 and the second electrode 600, even when other components of the dummy area DA, excluding the dummy light-emitting layer 500, e.g., the circuit element layer 200 of the dummy area DA, are formed to have the same structure as those of the components corresponding to the active area AA, e.g., the circuit element layer 200 of the active area AA, the light emission may not occur in the dummy pixel DP in the dummy area DA. Therefore, a manufacturing process of the dummy area DA and the active area AA may be more easily controlled.

Figure 4:
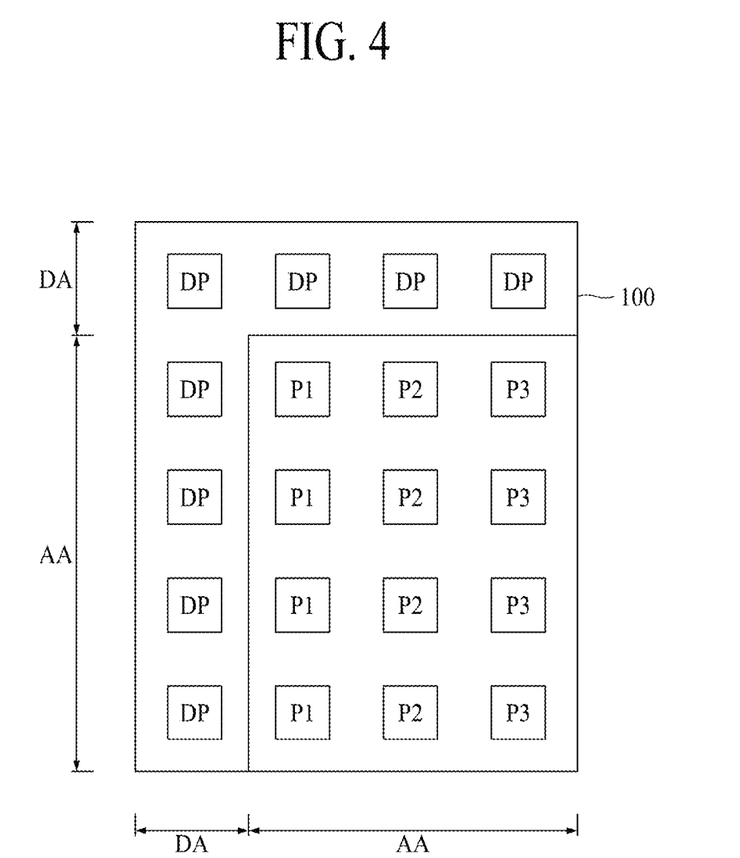
FIG. 4 is a plan view illustrating a state of an active area and a dummy area in an electroluminescence display apparatus according to an embodiment of the present disclosure.

FIG. 4 is a plan view illustrating a state of an active area and a dummy area in an electroluminescence display apparatus according to an embodiment of the present disclosure.

As illustrated in FIG. 4, the active area AA may be on the substrate 100, and the dummy area DA may be in an outer portion of the active area AA. FIG. 4 illustrates an upper left region of the substrate 100.

The active area AA may have a plurality of first pixels P1 emitting a first color, e.g., red light, a plurality of second pixels P2 emitting a second color, e.g., green light, and a plurality of third pixels P3 emitting a third color, e.g., blue light. The dummy area DA may have a plurality of dummy pixels DP. The dummy pixels DP may have a stacked structure of at least two light-emitting layers 510, 520, and 530 that may not emit light, as described above.

The plurality of first pixels P1, the plurality of second pixels P2, the plurality of third pixels P3, and the plurality of dummy pixels DP may be arranged in a matrix as illustrated, but embodiments of the present disclosure are not limited thereto. The plurality of first pixels P1 may be arranged in a line in any one column, the plurality of second pixels P2 may be arranged in a line in another column, and the plurality of third pixels P3 may be arranged in a line in another column. However, embodiments are not limited thereto, and the pixel arrangement may be modified to various forms known in the art.

Some of the plurality of dummy pixels DP may be arranged in columns different from the columns in which the first pixel P1, the second pixel P2, and the third pixel P3 are arranged. In addition, some of the plurality of dummy pixels DP may be arranged in the same column as the columns in which the first pixel P1, the second pixel P2, and the third pixel P3 are arranged. The array structure of the plurality of pixels P1, P2, and P3 and the plurality of dummy pixels DP may be modified to various forms known in the art.

Figure 5:
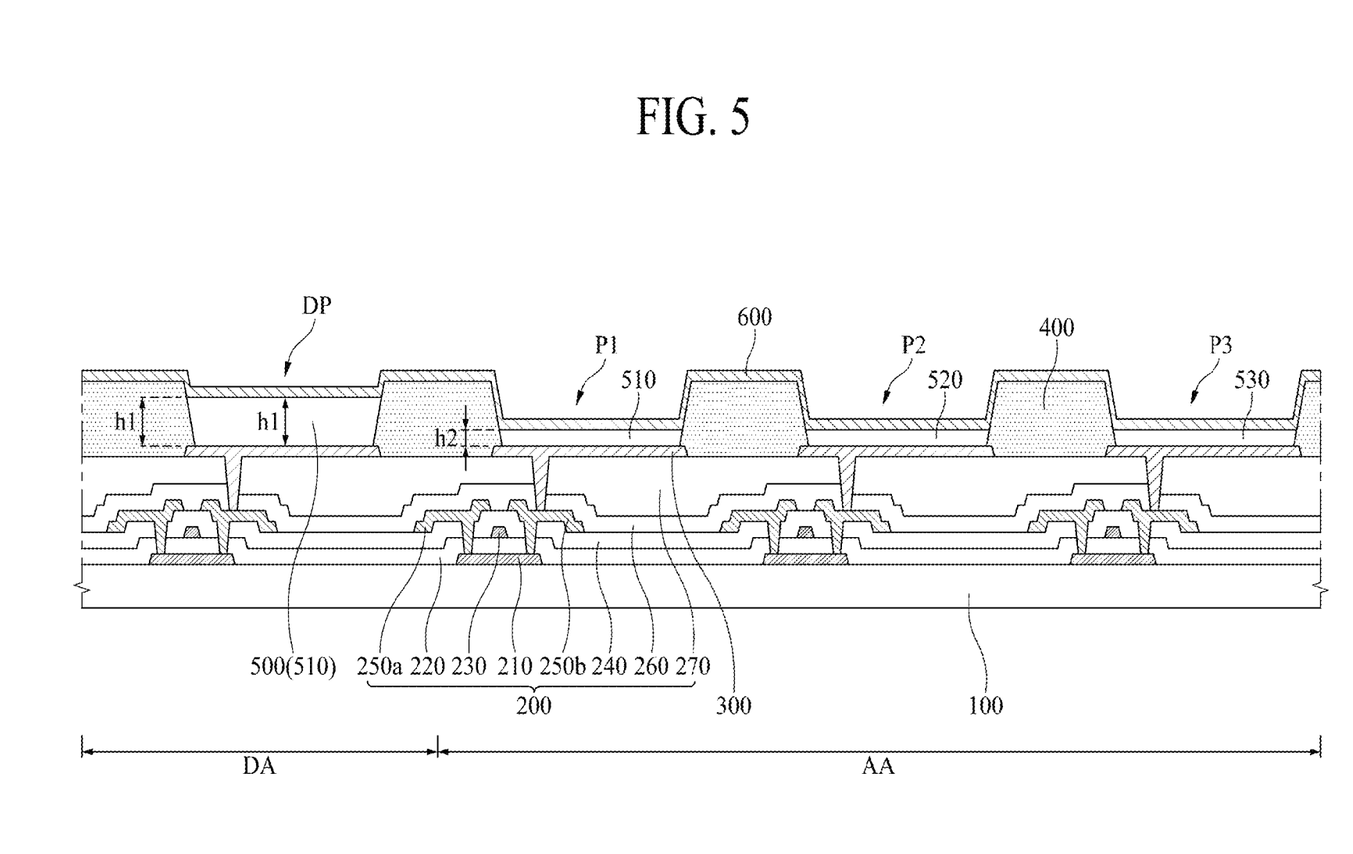
FIG. 5 is a cross-sectional view of an electroluminescence display apparatus according to another embodiment of the present disclosure.

FIG. 5 is a cross-sectional view of an electroluminescence display apparatus according to another embodiment of the present disclosure.

FIG. 5 is substantially similar to the electroluminescence display apparatus according to FIG. 3, except that the configuration of the dummy light-emitting layer 500 is changed. Therefore, the same reference numerals are given to the same components and only the different components will be described in detail below.

With reference to FIG. 5, the dummy light-emitting layer 500 provided in the dummy pixel DP of the dummy area DA may include only the first light-emitting layer 510. A thickness h1 of the first light-emitting layer 510 in the dummy light-emitting layer 500 may be greater than a thickness h2 of the first light-emitting layer 510 in the first pixel P1 of the active area AA.

For example, the thickness h1 of the first light-emitting layer 510 in the dummy light-emitting layer 500 may be set to a thickness that does not cause the light emission in a voltage range between the first electrode 300 and the second electrode 600. Thus, the first light-emitting layer 510 in the dummy light-emitting layer 500 may not emit light.

In this manner, in another embodiment of the present disclosure, the dummy light-emitting layer 500 may include only the first light-emitting layer 510, and the thickness h1 of the first light-emitting layer 510 provided in the dummy light-emitting layer 500 may be greater than the thickness h2 of the first light-emitting layer 510 provided in the first pixel P1 of the active area AA, whereby the light emission may be made in the first pixel P1, but the light emission may not occur in the dummy pixel DP.

Although it is illustrated that the dummy light-emitting layer 500 may be formed of only the first light-emitting layer 510, the dummy light-emitting layer 500 may be formed of only the second light-emitting layer 520 in the second pixel P2 of the active area AA or may be formed of only the third light-emitting layer 530 in the third pixel P3 of the active area AA.

Figure 6:
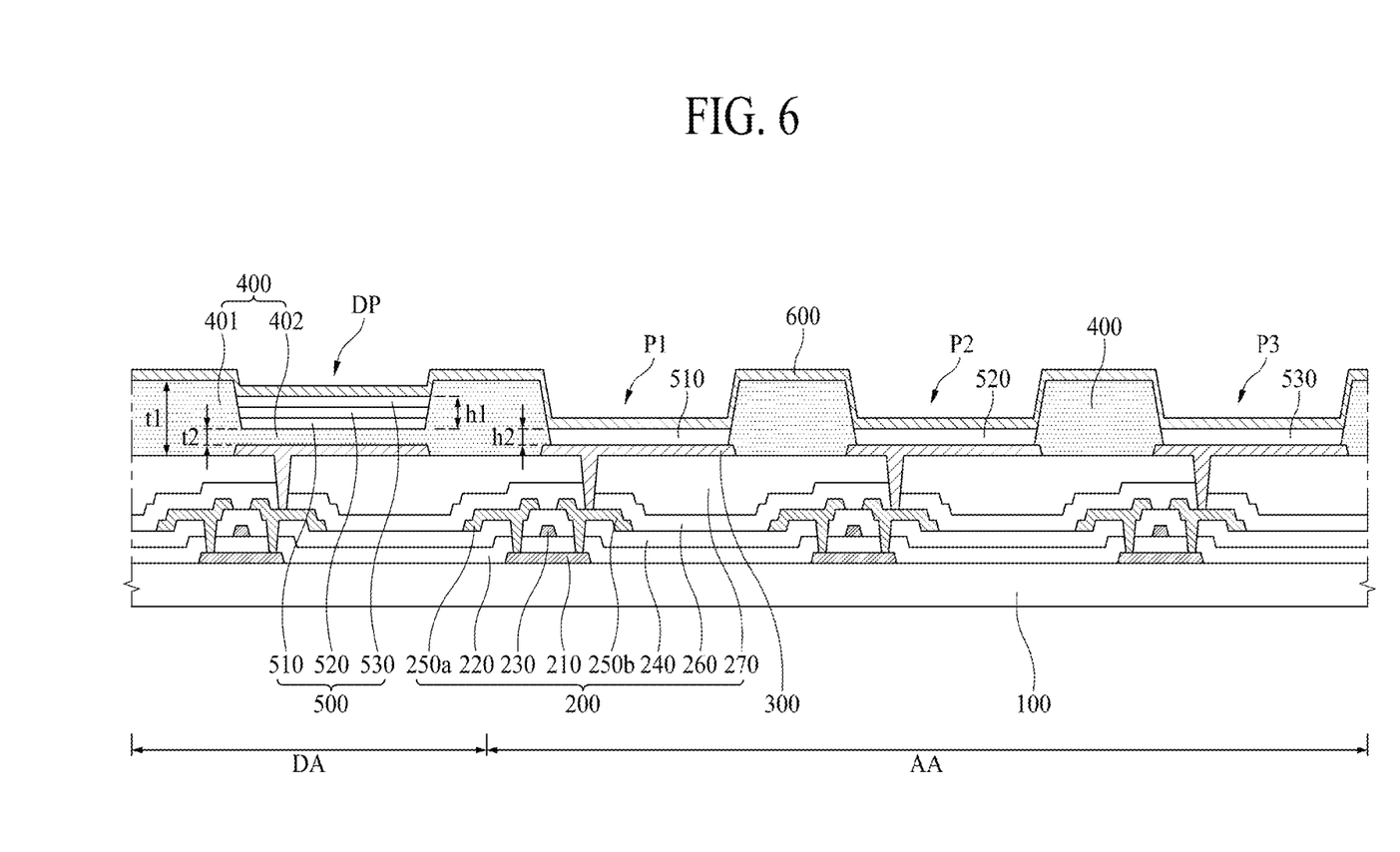
FIG. 6 is a cross-sectional view of an electroluminescence display apparatus according to still another embodiment of the present disclosure.

FIG. 6 is a cross-sectional view of an electroluminescence display apparatus according to still another embodiment of the present disclosure.

FIG. 6 is substantially similar to the electroluminescence display apparatus described above with reference to FIG. 3, except that a configuration of the bank 400 of the dummy area DA is changed. Therefore, the same reference numerals are given to the same components and only the different components will be described in detail below.

With reference back to FIG. 3, the bank 400 of the dummy area DA may be formed to cover both ends of the first electrode 300 of the dummy area DA. Therefore, the other remaining region of the first electrode 300 not covered by the bank 400 may contact a lower surface of the dummy light-emitting layer 500.

In contrast, with reference to FIG. 6, the bank 400 of the dummy area DA may cover the entire first electrode 300 of the dummy area DA. Thus, the first electrode 300 of the dummy area DA may not contact the dummy light-emitting layer 500, and a lower surface of the dummy light-emitting layer 500 may contact the bank 400.

That is, the bank 400 of the dummy area DA may include a first portion 401 having a matrix structure to define a dummy emission area in the dummy pixel DP, and a second portion 402 formed in the dummy emission area of the dummy pixel DP, connected to a lower portion of the first portion 401 and contacting the entire lower surface of the dummy light-emitting layer 500. Here, a thickness t1 of the first portion 401 may be greater than a thickness t2 of the second portion, and the dummy emission area may be defined by the first portion 401.

The electroluminescence display apparatus according to FIG. 6 may reduce or prevent the occurrence of the light emission from in the dummy light-emitting layer 500, even if the thickness h1 of the dummy light-emitting layer 500 is reduced due to a process error. For example, because the thickness h1 of the dummy light-emitting layer 500 may be set to a thickness in which light emission may not occur in a voltage range between the first electrode 300 and the second electrode 600, the light emission may not occur in the light-emitting layer 500. However, there is a possibility that the thickness h1 of the dummy light-emitting layer 500 may be thinner than the set thickness due to a process error. In this case, the light emission may occur in the dummy light-emitting layer 500.

In the electroluminescence display apparatus according to FIG. 6, the dummy light-emitting layer 500 may be prevented from being electrically connected to the first electrode 300 so that holes or electrons generated in the first electrode 300 may be prevented from moving to the dummy light-emitting layer 500, whereby the dummy light-emitting layer 500 may not emit light. For example, to prevent the dummy light-emitting layer 500 from being electrically connected to the first electrode 300, the second portion 402 of the bank 400 may be additionally formed between the dummy light-emitting layer 500 and the first electrode 300. That is, in the electroluminescence display apparatus according to FIG. 6, the structure of the bank 400 of the dummy area DA may be configured to be different from the structure of the bank 400 of the active area AA to reduce or prevent leakage of light in the dummy area DA.

When an electrical connection between the dummy light-emitting layer 500 and the first electrode 300 is interrupted, the thickness h1 of the dummy light-emitting layer 500 may be set to a thickness in which the light emission occurs in the voltage range between the first electrode 300 and the second electrode 300. That is, the thickness h1 of the dummy light-emitting layer 500 may be equal to the thickness h2 of the individual light-emitting layers 510, 520, and 530 in the individual pixels P1, P2, and P3 of the active area AA.

However, when cracking, or the like, occurs in the second portion 402 of the bank 400 between the dummy light-emitting layer 500 and the first electrode 300, the dummy light-emitting layer 500 and the first electrode 300 may be electrically connected again to cause the dummy light-emitting layer 500 to emit light. Thus, in preparation for an electrical connection between the dummy light-emitting layer 500 and the first electrode 300, the thickness h1 of the dummy light-emitting layer 500 may be set to a thickness range in which light emission may not occur in the voltage range between the first electrode 300 and the second electrode 600. Although not shown, in the electroluminescence display apparatus having the structure according to FIG. 6, the dummy light-emitting layer 500 may be configured as the dummy light-emitting layer 500 according to FIG. 5 described above.

Figure 7:
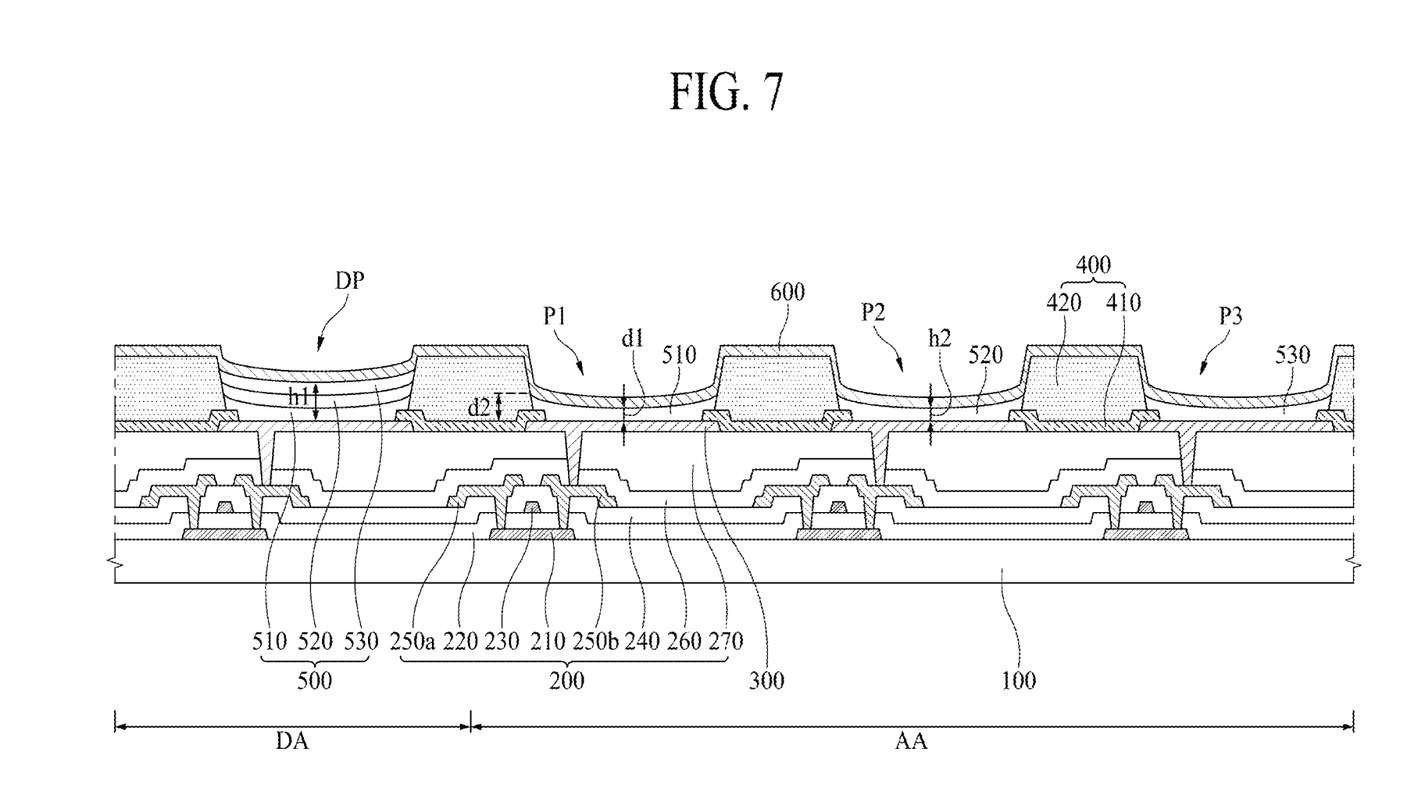
FIG. 7 is a cross-sectional view of an electroluminescence display apparatus according to yet another embodiment of the present disclosure.

FIG. 7 is a cross-sectional view of an electroluminescence display apparatus according to yet another embodiment of the present disclosure.

FIG. 7 is substantially similar to the electroluminescence display apparatus according to FIG. 3, except that the configuration of the bank 400, the light-emitting layers 510, 520, and 530, and the dummy light-emitting layer 500 is changed. Therefore, the same reference numerals are given to the same components and only the different components will be described in detail below.

As illustrated in FIG. 7, according to yet another embodiment of the present disclosure, the bank 400 may include a first bank 410 and a second bank 420. The first bank 410 may be on the circuit element layer 200, while covering an end of the first electrode 300. The first bank 410 may be thinner than the second bank 420, and may have a width that is larger than that of the second bank 420. The first bank 410 having such a structure may have the same hydrophilic properties as that of the light-emitting layers 510, 520, and 530 or the dummy light-emitting layer 500. The first bank 410 having the hydrophilic properties may be formed of an inorganic insulating material such as silicon oxide. Therefore, when the light-emitting layers 510, 520, and 530 or the dummy light-emitting layer 500 may be formed by an inkjet process, a solution for forming the light-emitting layers 510, 520, and 530 or the dummy light-emitting layer 500 may be easily spread on the first bank 410.

The second bank 420 may be on the first bank 410. The second bank 420 may have a narrower width than the first bank 410. The second bank 420 may be patterned and formed through a photolithography process after applying a solution mixed with a hydrophobic material, such as fluorine, to an organic insulating material having hydrophilic properties. The hydrophobic material, such as fluorine, may be moved to an upper portion of the second bank 420 due to light irradiated in the photolithography process. Accordingly, the upper portion of the second bank 420 may have hydrophobic properties, whereas the other portions may have hydrophilic properties. That is, the lower portion of the second bank 420 contacting the first bank 410 may have hydrophilic properties, and the upper portion of the second bank 420 may have hydrophobic properties. However, embodiments of the present disclosure are not limited thereto. For example, the entirety of the second bank 420 may have hydrophobic properties.

The spreadability of the solution for forming the light-emitting layers 510, 520, and 530 or the dummy light-emitting layer 500 may be improved by the lower portions of the first bank 410 and the second bank 420 having the hydrophilic properties. For example, when the first bank 410 is formed to have a smaller thickness and a larger width than the second bank 420, a two-step structure having hydrophilic properties may be provided by the combination of the first bank 410 and the second bank 420, and the solution for forming the light-emitting layers 510, 520, and 530 or the dummy light-emitting layer 500 may be easily spread to left and right ends of the emission area of the individual pixels P1, P2, and P3 or to left and right ends of the dummy emission area of the dummy pixel DP. Also, when the solution for forming the light-emitting layers 510, 520, and 530 is prevented from spreading to the neighboring other pixel P1, P2 or P3 region by the upper portion of the second bank 420 having the hydrophobic properties, the light-emitting layers 510, 520, and 530 may be prevented from being mixed between the neighboring pixels P1, P2, and P3.

In the dummy area DA, the dummy light-emitting layers 500 may be mixed with each other between neighboring dummy pixels DP. Therefore, an upper portion of the second bank 420 provided in the dummy area DA may not need to have hydrophobic properties. However, in terms of process convenience, for example, the second bank 420 provided in the dummy area DA may be formed through the same process as that of the second bank 420 provided in the active area AA. Thus, the second bank 420 in the dummy area DA may have the same characteristics as that of the second bank 420 in the active area AA.

The light-emitting layers 510, 520 and 530 in the active area AA and the dummy light-emitting layer 500 in the dummy area DA may be on the first electrode 300. The light-emitting layers 510, 520, and 530 and the dummy light-emitting layer 500 may be formed through an ink jet process.

When the light-emitting layers 510, 520, and 530 provided in the active area AA are formed through the ink jet process, after a solution for the light-emitting layers 510, 520, and 530 is dried, a height d1 of the upper ends of the light-emitting layers 510, 520 and 530 at a central portion of the emission areas may be lower than a height d2 of the upper ends of the light-emitting layers 510, 520, and 530 at the end of the emission area. For example, as illustrated, a profile in which the height of the light-emitting layers 510, 520, and 530 gradually decreases from the end of the emission area toward the central portion of the emission area may be obtained. Accordingly, the portion of the second electrode 600 formed on the light-emitting layers 510, 520, and 530 may have a profile corresponding to the profile of the light-emitting layers 510, 520, and 530.

When the dummy light-emitting layer 500 in the dummy area DA is also formed through the ink jet process, the dummy light-emitting layer 500 may have the same profile as that of the light-emitting layers 510, 520, and 530 provided in the active area AA. For example, the first light-emitting layer 510, the second light-emitting layer 520, and the third light-emitting layer 530 in the dummy light-emitting layer 500 may also have the same profile as that of the light-emitting layers 510, 520, and 530 in the active area AA. Although not shown, in the electroluminescence display apparatus having the structure according to FIG. 7, the dummy light-emitting layer 500 may be formed as the dummy light-emitting layer 500 according to FIG. 5 described above.

Figure 8:
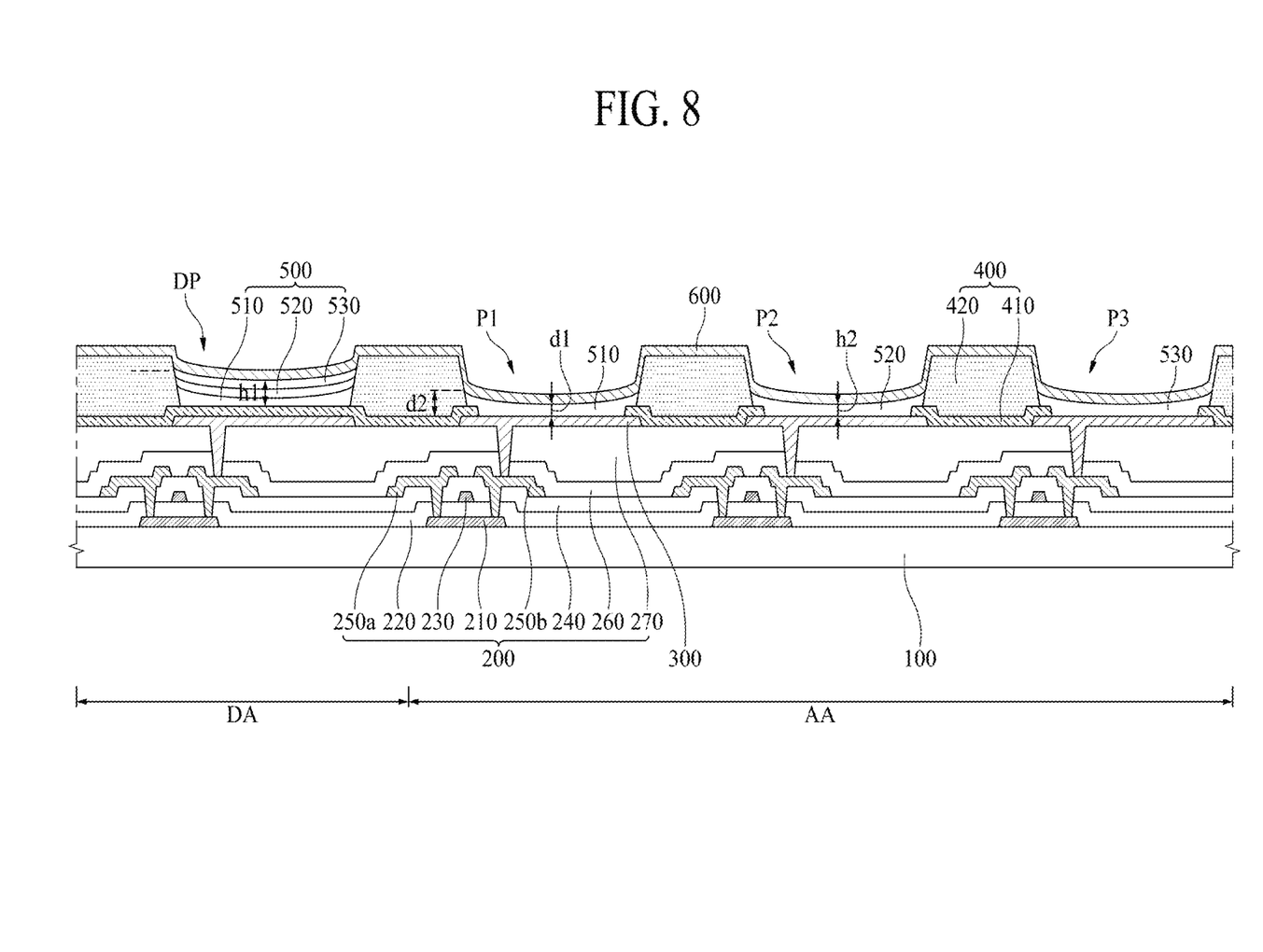
FIG. 8 is a cross-sectional view of an electroluminescence display apparatus according to still yet another embodiment of the present disclosure.

FIG. 8 is a cross-sectional view of an electroluminescence display apparatus according to still yet another embodiment of the present disclosure.

FIG. 8 is substantially similar to the electroluminescence display apparatus according to FIG. 7, except that a configuration of the first bank 410 is changed. Therefore, the same reference numerals are given to the same components and only the different components will be described in detail below.

With reference back to FIG. 7, the first bank 410 of the dummy area DA may cover both ends of the first electrode 300 of the dummy area DA. Thus, the other remaining area of the first electrode 300 of the dummy area DA, which may not be covered by the first electrode 410, may contact a lower surface of the dummy light-emitting layer 500.

In contrast, with reference to FIG. 8, the first bank 410 of the dummy area DA may cover the entire first electrode 300 of the dummy area DA. Thus, the first electrode 300 of the dummy area DA may not contact the dummy light-emitting layer 500, and the entire lower surface of the dummy light-emitting layer 500 may contact the first bank 410. Therefore, the first bank 410 may be formed in the entire dummy area DA, and a dummy emission area may be defined in the dummy pixel DP by the second bank 420 provided on the first bank 410.

Like the electroluminescence display apparatus according to FIG. 6 described above, in the electroluminescence display apparatus according to FIG. 8, although the thickness h1 of the dummy light-emitting layer 500 may be reduced due to a process error, the occurrence of light emission in the dummy light-emitting layer 500 may be prevented.

That is, when the thickness h1 of the dummy light-emitting layer 500 is thinner than a predetermined thickness due to a process error, the first bank 410 may be additionally formed between the dummy light-emitting layer 500 and the first electrode 300 to interrupt an electrical connection between the dummy light-emitting layer 500 and the first electrode. Accordingly, holes or electrons generated in the first electrode 300 may be prevented from moving to the dummy light-emitting layer 500, whereby the dummy light-emitting layer 500 may not emit light.

When cracking, or the like, occurs in the first bank 410 between the dummy light-emitting layer 500 and the first electrode 300, the dummy light-emitting layer 500 and the first electrode 300 may be electrically connected. In preparation for this occurrence, the thickness h1 of the dummy light-emitting layer 500 may be set to a thickness range in which the light emission does not occur between the first electrode 300 and the second electrode 600.

Although not shown, the structure of the second bank 420 in the dummy area DA in the electroluminescence display apparatus having the structure according to FIG. 8 may be configured as the structure additionally including the second portion 402 of the bank 400 in the dummy area DA, as illustrated in FIG. 6 described above. In this case, although cracking may occur in the first bank 410, an electrical connection between the dummy light-emitting layer 500 and the first electrode 300 may be interrupted by the second portion 402 of the second bank 420.

Also, in the structure according to FIG. 8, the first bank 410 in the dummy area DA may have a substantially similar structure as that of the first bank provided in the dummy area DA, as illustrated in FIG. 7 described above. The structure of the second bank 420 in the dummy area DA in the structure according to FIG. 8 may be configured as the structure additionally including the second portion 402 of the bank 400 in the dummy area DA, as illustrated in FIG. 6 described above. In addition, in the structure according to FIG. 8, the dummy light-emitting layer 500 may be configured as the dummy light-emitting layer 500 according to FIG. 5 described above.

According to an embodiment of the present disclosure, when the dummy area DA is formed at an outer portion of the active area AA, although an error may occur in terms of manufacturing process, the error may not occur in the active area AA, but may occur in the dummy area DA. Accordingly, light emission may be made uniformly throughout the active area AA. For example, according to an embodiment of the present disclosure, when the dummy light-emitting layer in the dummy area DA has the thickness in which the dummy light-emitting layer in the dummy area DA does not emit light by an electric field between the first electrode and the second electrode, light leakage in the dummy area DA may be reduced or prevented, thus improving display quality.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. An electroluminescence display apparatus, comprising:
   a substrate comprising:
      an active area; and
      a dummy area;
   a bank on the substrate, the bank being configured to define:
      a plurality of emission areas in the active area; and
      a plurality of dummy emission areas in the dummy area;
   a light-emitting layer in each of the plurality of emission areas; and
   a dummy light-emitting layer in each of the plurality of dummy emission areas, a thickness of the dummy light-emitting layer being greater than a thickness of the light-emitting layer.

2. The electroluminescence display apparatus of claim 1, wherein:
   the light-emitting layer comprises:
      a first pixel comprising a first light-emitting layer;
      a second pixel comprising a second light-emitting layer; and
      a third pixel comprising a third light-emitting layer; and
   the dummy light-emitting layer comprises a stacked structure comprising at least two of: the first light-emitting layer, the second light-emitting layer, and the third light-emitting layer.

3. The electroluminescence display apparatus of claim 1, wherein:
   the light-emitting layer comprises:
      a first pixel comprising a first light-emitting layer;
      a second pixel comprising a second light-emitting layer; and
      a third pixel comprising a third light-emitting layer; and
   the dummy light-emitting layer comprises one of: the first light-emitting layer, the second light-emitting layer, and the third light-emitting layer.

4. The electroluminescence display apparatus of claim 1, further comprising a first electrode below the dummy light-emitting layer, the first electrode being electrically isolated from the dummy light-emitting layer.

5. The electroluminescence display apparatus of claim 1, further comprising:
   a first electrode below the dummy light-emitting layer,
   wherein the bank is additionally between the dummy light-emitting layer and the first electrode.

6. The electroluminescence display apparatus of claim 1, wherein the bank in the dummy area has a structure different from that of the bank in the active area.

7. The electroluminescence display apparatus of claim 1, wherein the bank in the dummy area comprises:
   a first portion defining the plurality of dummy emission areas; and
   a second portion having a thickness smaller than that of the first portion, the second portion being in the plurality of dummy emission areas.

8. The electroluminescence display apparatus of claim 7, wherein the second portion contacts a lower surface of the dummy light-emitting layer.

9. The electroluminescence display apparatus of claim 1, wherein:
   the bank comprises:
      a first bank; and
      a second bank on the first bank, the second bank having a width smaller than that of the first bank and a thickness greater than that of the first bank.

10. The electroluminescence display apparatus of claim 9, wherein:
    the first bank in the dummy area is in the plurality of dummy emission areas; and
    a lower surface of the dummy light-emitting layer contacts the first bank.

11. The electroluminescence display apparatus of claim 1, further comprising a circuit element layer between the substrate and the bank, the circuit element layer having the same structure in the active area and the dummy area.

12. The electroluminescence display apparatus of claim 1, wherein a thickness of the dummy light-emitting layer is within a range of 1.5 to 3 times a thickness of the light-emitting layer.

13. An electroluminescence display apparatus, comprising:
    a substrate comprising:
       an active area; and
       a dummy area;
    a bank on the substrate and configured to define:
       a plurality of emission areas in the active area; and
       a plurality of dummy emission areas in the dummy area;
    a dummy light-emitting layer in each of the plurality of dummy emission areas;
    a first electrode below the dummy light-emitting layer; and
    a second electrode above the dummy light-emitting layer,
       wherein the dummy light-emitting layer has a thickness such that no light emission occurs by an electric field between the first electrode and the second electrode.

14. The electroluminescence display apparatus of claim 13, wherein:
    the active area comprises:
       a first pixel comprising a first light-emitting layer;
       a second pixel comprising a second light-emitting layer; and
       a third pixel comprising a third light-emitting layer; and
    the dummy light-emitting layer has a stacked structure comprising at least two of: the first light-emitting layer, the second light-emitting layer, and the third light-emitting layer.

15. The electroluminescence display apparatus of claim 13, wherein:
    the active area comprises:
       a first pixel comprising a first light-emitting layer;
       a second pixel comprising a second light-emitting layer; and
       a third pixel comprising a third light-emitting layer; and
    the dummy light-emitting layer comprises one of: the first light-emitting layer, the second light-emitting layer, and the third light-emitting layer.

16. The electroluminescence display apparatus of claim 13, wherein the dummy light-emitting layer and the first electrode are not in contact with each other.

17. The electroluminescence display apparatus of claim 16, wherein the bank is additionally between the dummy light-emitting layer and the first electrode.

18. The electroluminescence display apparatus of claim 13, further comprising:

a light-emitting layer in the plurality of emission areas, wherein a thickness of the dummy light-emitting layer is within a range of 1.5 to 3 times a thickness of the light-emitting layer.

* * * * *